United States Patent
Budach et al.

(10) Patent No.: US 11,150,552 B2
(45) Date of Patent: Oct. 19, 2021

(54) METHOD AND APPARATUS FOR ANALYZING A DEFECTIVE LOCATION OF A PHOTOLITHOGRAPHIC MASK

(71) Applicant: Carl Zeiss SMT GmbH, Oberkochen (DE)

(72) Inventors: Michael Budach, Hanau (DE); Ralf Schönberger, Wiesbaden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 36 days.

(21) Appl. No.: 16/563,303

(22) Filed: Sep. 6, 2019

(65) Prior Publication Data

US 2020/0004138 A1    Jan. 2, 2020

Related U.S. Application Data

(63) Continuation of application No. PCT/EP2018/055037, filed on Mar. 1, 2018.

(30) Foreign Application Priority Data

Mar. 9, 2017  (DE) .......................... 102017203879.9

(51) Int. Cl.
*G06T 7/00* (2017.01)
*G03F 1/84* (2012.01)
*G03F 1/72* (2012.01)

(52) U.S. Cl.
CPC .................. *G03F 1/84* (2013.01); *G03F 1/72* (2013.01); *G06T 7/001* (2013.01); *G06T 2207/30148* (2013.01)

(58) Field of Classification Search
CPC ... G03F 1/72; G03F 1/84; G06T 2207/30148; G06T 7/001; G06T 7/0004; G01N 21/95607; G01N 2021/95676
(Continued)

(56) References Cited

U.S. PATENT DOCUMENTS 5,849,440 A  12/1998  Lucas et al.
5,916,716 A   6/1999  Butsch et al.
(Continued)

FOREIGN PATENT DOCUMENTS

CN    105652589    6/2016    ............... G03F 1/84
DE    10141422     5/2002    ............ G01M 11/02
(Continued)

OTHER PUBLICATIONS

The International Search Report and Written Opinion of the International Searching Authority for International Application No. PCT/EP2018/055037 dated Jul. 27, 2018.
(Continued)

*Primary Examiner* — Isiaka O Akanbi
(74) *Attorney, Agent, or Firm* — Fish & Richardson P.C.

(57) ABSTRACT

The present invention relates to a method for analyzing at least one defective location of a photolithographic mask, having the following steps: (a) obtaining measurement data for the at least one defective location of the photolithographic mask; (b) determining reference data of the defective location from computer-aided design (CAD) data for the photolithographic mask; (c) correcting the reference data with at least one location-dependent correction value; and (d) analyzing the defective location by comparing the measurement data to the corrected reference data.

24 Claims, 11 Drawing Sheets

(58) Field of Classification Search
USPC .......................................... 356/237.1–237.6
See application file for complete search history.

(56) References Cited

U.S. PATENT DOCUMENTS

| | | | |
|---|---|---|---|
| 2001/0002697 A1* | 6/2001 | Hiroi | ..................... H01J 37/28 |
| | | | 250/310 |
| 2001/0053243 A1* | 12/2001 | Norioka | .................. G06T 7/001 |
| | | | 382/145 |
| 2002/0024019 A1 | 2/2002 | Matsuoka | |
| 2003/0104288 A1 | 6/2003 | Pang | |
| 2003/0174876 A1 | 9/2003 | Eran et al. | |
| 2005/0004774 A1 | 1/2005 | Volk et al. | |
| 2005/0079425 A1 | 4/2005 | Blocket et al. | |
| 2006/0239535 A1 | 10/2006 | Takada et al. | |
| 2008/0260234 A1* | 10/2008 | Yamashita | ....... G01N 21/95607 |
| | | | 382/144 |
| 2009/0129664 A1* | 5/2009 | Tsuchiya | ................. G06T 7/001 |
| | | | 382/149 |
| 2010/0002930 A1 | 1/2010 | Miyano | |
| 2010/0096550 A1 | 4/2010 | Yamazaki et al. | |
| 2012/0098953 A1 | 4/2012 | Kotaki et al. | |
| 2014/0255831 A1 | 9/2014 | Hofmann et al. | |
| 2015/0279024 A1 | 10/2015 | Tsuckiya et al. | |
| 2016/0116420 A1 | 4/2016 | Duffy et al. | |
| 2016/0171674 A1* | 6/2016 | Tsuchiya | ................. G06K 9/036 |
| | | | 382/149 |
| 2016/0203595 A1* | 7/2016 | Tsuchiya | ................... G03F 1/84 |
| | | | 348/126 |
| 2016/0292839 A1* | 10/2016 | Inoue | .................. G01N 21/956 |
| 2017/0032507 A1* | 2/2017 | Otaki | ................... G02B 21/245 |
| 2017/0206433 A1* | 7/2017 | Ogawa | ..................... G06T 7/74 |
| 2017/0262976 A1 | 9/2017 | Choi et al. | |

FOREIGN PATENT DOCUMENTS

| | | | |
|---|---|---|---|
| DE | 10233205 | 4/2004 | ............... G03F 1/00 |
| DE | 102013203995 | 9/2014 | ........... H01L 21/027 |
| DE | 102014204876 | 10/2014 | ............... G03F 1/84 |
| EP | 2983193 | 2/2016 | ............ H01J 37/317 |
| JP | 2004-213030 | 7/2004 | ............... G03F 1/08 |
| JP | 2005-037166 | 2/2005 | ........... G01N 21/956 |
| JP | 2005-215400 | 8/2005 | ............... G03F 1/06 |
| JP | 2005-331250 | 12/2005 | ........... G01N 21/956 |
| JP | 2006-250845 | 9/2006 | ........... G01N 21/956 |
| JP | 2011-197120 | 10/2011 | ............... G03F 1/08 |
| KR | 1020080114493 | 12/2008 | ........... H01L 21/027 |
| KR | 1020170024909 | 3/2017 | ............... A61B 6/00 |
| TW | 200939283 | 9/2009 | ............. H01J 37/29 |
| TW | 201627655 | 8/2016 | ............. C01N 21/88 |
| WO | WO 00/60415 | 10/2000 | ............... G03F 1/14 |
| WO | WO 2006/073155 | 7/2006 | ........... G01N 21/956 |

OTHER PUBLICATIONS

The German Office Action for German Application No. 10 2017 203 879.9 dated Nov. 7, 2017.
The Taiwan Office Action for Taiwan Application No. 107106601 dated Jun. 11, 2019.
Boegli et al., "Mask repair using layout-based pattern copy for the 65 nm node and beyond", SPIE, vol. 6349, Photomask Technology 2006, pp. 63491G-1-63491G-8, dated Oct. 20, 2006.
The Notice for Reasons for Rejection issued by the Korean Patent Office for Korean Patent Application No. KR 10-2019-7029072, dated Oct. 7, 2020 (with English Translation).
Notice of Allowance issued by the Korean Intellectual Property Office for Korean Application No. 10-2019-7029072, dated Jun. 11, 2021 (with English Translation).

* cited by examiner

METHOD AND APPARATUS FOR ANALYZING A DEFECTIVE LOCATION OF A PHOTOLITHOGRAPHIC MASK

CROSS-REFERENCE TO RELATED APPLICATIONS

This application is a continuation of and claims priority under 35 U.S.C. § 120 from PCT Application PCT/EP2018/055037, filed on Mar. 1, 2018, which claims priority from German Application DE 10 2017 203 879.9, filed on Mar. 9, 2017. The entire contents of each of these priority applications are incorporated herein by reference.

TECHNICAL FIELD

The present invention relates to a method and an apparatus for analyzing a defective location of a photolithographic mask.

BACKGROUND

As a consequence of the growing integration density in the semiconductor industry, photolithography masks have to image increasingly smaller structures on wafers. In order to produce the small structural dimensions imaged onto the wafer, increasingly complex processing processes are required. These must ensure in particular that non-processed semiconductor material is not changed inadvertently and/or in an uncontrolled manner by the processing processes.

In terms of photolithography, the trend towards growing integration density is addressed by shifting the exposure wavelength of lithography systems to ever shorter wavelengths. Currently frequently used as a light source in lithography systems is an ArF (argon fluoride) excimer laser that emits at a wavelength of approximately 193 nm.

Lithography systems are being developed today that use electromagnetic radiation in the EUV (extreme ultraviolet) wavelength range (preferably in the range of 10 nm to 15 nm). Said EUV lithography systems are based on a completely new beam guiding concept which uses reflective optical elements without exception, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist arranged on a wafer is due to photolithographic masks, exposure masks, photomasks or just masks. With each increase in integration density, it becomes more important to improve the minimum structure size of the exposure masks. The production process of photolithographic masks therefore becomes increasingly complex and as a result more time-consuming and ultimately also more expensive. Due to the minute structure sizes of the pattern elements, defects during mask production cannot be ruled out. These must be repaired wherever possible.

Before defects of photolithographic masks can be repaired, the defects must be found and analyzed. One form of analysis of a defect is to ascertain the contour of a defect. To ascertain the contour of a defect, frequently a defective region of a photomask is compared to an equivalent region of a mask that has no defect. A region that is equivalent to a defective region is a region of the photolithographic mask that has the same arrangement of pattern elements as the defective region, without there being a defect in the equivalent region.

The partial image at the top of FIG. 1 shows a section or an image field of a scanning electron microscope recording with a defect that extends over several pattern elements of an absorber structure. In the lower left-hand peripheral region, a rectangle is marked that represents an equivalent region or a reference region, whose dimensions are greater than the defect but which does not have a defect. The partial image at the bottom of FIG. 1 shows, indicated by an arrow, the superposition of the defect-free reference region with the defective region of the scanning electron microscope recording. From the superposition of the two image sections, the complete contour of the defect—accentuated by a lighter color—can be determined.

In the example of FIG. 1, a suitable reference region is expediently present together with the defect in the same image field of a scanning electron microscope recording. If this is not the case, it is possible to search for and use a reference region at a different position on the photomask. However, the manual search for a suitable reference region can be time-consuming. In addition, the operator of the scanning electron microscope may erroneously select a reference region with a structure of pattern elements of similar appearance. In addition, it may be possible that there is no second region on the photomask that has the same pattern of pattern elements as the defective region, which may prevent the inspection of the defect, or at least make it more difficult.

The documents mentioned below describe approaches for alleviating said problems: EP 2 983193 A1, US 2003/0174876 A1, U.S. Pat. Nos. 5,849,440 and 5,916,716.

However, these documents do not address the repair of defects of photolithographic masks.

The underlying problem of the present invention is therefore to specify an improved method and an improved apparatus for analyzing a defective location of a photolithographic mask.

SUMMARY

In accordance with one exemplary embodiment of the present invention, this problem is solved by a method for analyzing at least one defective location of a photolithographic mask, in which the method comprises the following steps: (a) obtaining measurement data for the at least one defective location of the photolithographic mask; (b) determining reference data of the defective location from computer-aided design (CAD) data for the photolithographic mask; (c) correcting the reference data with at least one location-dependent correction value; and (d) analyzing the defective location by comparing the measurement data to the corrected reference data.

Since the systematic changes the CAD data undergo during a mask production process are taken into consideration not just globally but also locally during the inspection of defective locations, the analysis of defects can be performed with greater accuracy. Firstly, the rate of defects that were detected erroneously is reduced hereby, which reduces the complexity of the mask inspection. Secondly, identified defects can be repaired with greater precision, which increases the yield in the mask production.

Furthermore, due to the defect inspection with the aid of the CAD data (die-to-database inspection), it is also possible for defective locations of a photolithographic mask to be inspected that have no usable equivalent region or no reference region. Moreover, the manual search for a reference region and the erroneous comparison of a defective location to a mask section that has a similar pattern of pattern elements can be dispensed with.

In addition, the use of the CAD data for determining a location-dependent correction value for correcting the reference data facilitates better automation of the analysis process since the above-mentioned manual search for a reference region has been dispensed with.

Finally, the production inaccuracy of the reference region used (key point: "line edge roughness") and the measurement inaccuracy associated with the data recording of the reference region used are omitted when using the CAD data for the comparison with defective locations. By using CAD data instead of a reference region, it is thus possible to achieve a lower variance of the results of the inspected defective locations.

The property "location-dependent" in this application means that a correction value is not constant over the area of a photolithographic mask but is dependent on the observed position of the mask.

In one further embodiment, the method for analyzing at least one defective location of a photolithographic mask comprises the following steps: (a) obtaining measurement data for the at least one defective location of the photolithographic mask; (b) determining reference data of the defective location from computer-aided design (CAD) data for the photolithographic mask; (c) determining a contour of the at least one defective location from the measurement data and the reference data; and (d) analyzing the defective location by correcting the contour of the at least one defective location with at least one location-dependent correction value.

In the second embodiment of a method according to the invention, the location-dependent correction value or values is/are not used for correcting the reference data, but for correcting the contour of a defective location or of a defect of a photomask, said contour having been determined from the measurement data and the reference data. The second embodiment thus applies a (global) bias to the reference data and one or more location-dependent correction values to the contour determined for a defect or the defective location.

The advantages of a method according to the invention stated above also apply at least partially to the second exemplary embodiment. This second embodiment can be advantageously used in particular when it is not possible to directly access the reference data.

Obtaining the measurement data for the at least one defective location of the photolithographic mask can comprise scanning the at least one defective location using a particle beam.

Obtaining the measurement data can furthermore comprise: obtaining coordinates for the at least one defective location from an inspection tool for the photolithographic mask. The particle beam can comprise an electron beam.

On the basis of the coordinates obtained from an inspection tool, it is possible to use a particle beam, preferably an electron beam, to analyze in detail the defective location and a region around a defective location of a photolithographic mask.

A method according to the invention may furthermore include the step of: producing a measurement data image from the measurement data. The measurement data image can comprise a two-dimensional representation of the measurement data on a monitor.

Determining reference data can comprise: extracting a section from the CAD data which comprises the at least one defective location of the photolithographic mask.

For extracting the section of the CAD data, the coordinates of the defective location that are supplied by the inspection tool can be used. It is also possible to determine the section of the required CAD data on the basis of the region of the photomask that has been scanned by the particle beam.

Determining reference data can comprise synthesizing a reference image from the CAD data.

A method according to the invention can be performed on the basis of data, i.e. measurement data, reference data and corrected reference data, or of images, i.e. measurement data images, reference images and corrected reference images.

Producing or synthesizing a reference image from CAD data is typically referred to in the art as "rendering."

Synthesizing the reference image can comprise taking into account in the reference image systematic changes that CAD data undergo during a mask production process.

Several contributions make a contribution to the change of the CAD data during the transfer to a photomask: the exposure step, the development of the photoresist, the etching of the pattern elements of the absorber structure, and the imaging or measurement of the pattern elements produced. This enumeration is not complete. The three contributions first mentioned, for example, result in rounded corners of the pattern elements generated on a mask. The above-mentioned contributions are furthermore responsible for the occurrence of a bias, i.e. a deviation of the dimensions of structure elements of the CAD data and of the measurement data.

Synthesizing the reference image can furthermore comprise producing a light boundary for at least one structure element of the reference image.

Images that are produced due to exposure with an electron beam have a material contrast and a topography contrast. The topography contrast is produced preferably at edges and/or corners of a structure element. For this reason, the structure elements in images of a scanning electron microscope (SEM) typically have a light boundary that is preferably used for aligning two images during their superposition. For the reasons stated above, the light edges of imaged structure elements do not correspond to the edges of the structure elements that have been generated from CAD data.

The at least one structure element can comprise an element from the group: a pattern element of the photolithographic mask, a mark of the photolithographic mask, and a defect of the at least one defective location of the photolithographic mask.

A mark of a photomask can be used for adjusting a particle beam with respect to a defective location.

Synthesizing the reference image can furthermore comprise determining parameters of a point spread function that describes an exposure process for the photolithographic mask during a mask production process.

A point spread function (PSF) is frequently used to describe the interaction of a particle beam with the photoresist and/or the absorbing and/or phase-shifting material of a photomask during an exposure process.

The point spread function can comprise an addition of at least two Gaussian distributions. A first Gaussian distribution can describe a forwards scattering of particles of the particle beam in a photoresist arranged on the photolithographic mask and/or in the photolithographic mask, and at least one second Gaussian distribution can describe a backwards scattering of the particles of the particle beam in a photoresist arranged on the photolithographic mask and/or in the photolithographic mask.

The point spread function can furthermore be designed to take into account an asymmetry of a bias with respect to a first and a second direction in a plane of the photolithographic mask, wherein the first and the second direction preferably form a right angle. This asymmetry of the deltas between the structure elements of the CAD data and the photomask can be taken into consideration by a combination of two or more of the Gaussian distributions stated above.

This design of the point spread function makes it possible to take into consideration local asymmetric changes of the CAD data during the production of the pattern elements of a photomask in the analysis of defective locations.

The at least one location-dependent correction value can take into consideration a difference between a critical dimension (CD) of the measurement data and of the CAD data at the defective location.

Since the correction value or values is/are not considered to be constant over a mask but depend on the position on the photomask, local adaptations can be performed for the above-described systematic changes of the CAD data during transfer onto a photomask. As a result, the correspondence of measurement data of a defective region and the corrected reference data generated for the defective region can be improved.

A method for analyzing a defective location of a photolithographic mask can furthermore include the step of: determining the at least one location-dependent correction value by minimizing the difference between the CD of the structure elements of the measurement data image and of the reference image for each of the at least one defective location of the photolithographic mask.

Minimizing the difference between the CD of the structure elements of the measurement data image and of the reference image can be effected in a region of the photolithographic mask around the at least one defective location, wherein the region excludes the at least one defective location, and wherein the region is larger than the at least one defective location.

The region of the defective location that has a defect can be excluded from an image comparison. This can be expedient because a deviation from the design is already present in the region of the defect, and the defect could be a disturbance in the image comparison.

Minimizing the difference between the CD of the structure elements of the measurement data image and of the reference image can comprise determining the parameters of the point spread function in the region around the at least one defective location, with the result that the difference between the CD of the structure elements of the measurement data image and of the reference image becomes minimal.

Due to the parameters of the point spread function that describes the mask production process being made to be location-dependent and being determined individually locally for each defective location, the correspondence between a measurement data image of each defect and the associated reference image is optimized. A defect can thus be inspected accurately and be repaired precisely.

In the exemplary embodiment described, determining the location-dependent correction value is effected as a first step in an inspection process of a defective location.

Determining the at least one location-dependent correction value can comprise performing an algorithm that minimizes the difference between the CD of the structure elements of the measurement data image and the CD of the structure elements of the reference image.

If a defective location is so large as to fill a maximum region to the extent that undisturbed CD determination of the structure elements of the measurement data image is no longer possible or appears doubtful, a region next to the defective location is used to minimize the CD difference between the structure elements of the measurement data image and of the reference image. The maximum region is determined, for example, by the maximum number of image points or pixels that are storable in an image memory. The maximum region can furthermore be limited by the maximum deflectability of a particle beam of an apparatus for analyzing a photolithographic mask while observing prescribed imaging aberrations.

The method according to the invention may furthermore include the step of: determining a distribution of the CD of at least one pattern element and/or a mark over the photolithographic mask.

This procedure represents an alternative to minimizing the CD of the structure elements of the measurement data image and of the reference image. It requires measurement of the CD distribution over a photomask before the inspection of the defective location(s) of the mask. On the other hand, this alternative permits the ascertainment of the distribution of the correction values before an analysis process of the defective mask is performed.

In addition, the method according to the invention can include the step of: determining at least one location-dependent correction value from the distribution of the CD of the at least one pattern element and/or the mark, and producing a corrected reference image with the aid of the produced distribution of the CD.

Determining the at least one location-dependent correction value can comprise determining location-dependent parameters of the point spread function.

Correcting the reference data can comprise creating a corrected reference image by correcting the reference image with the at least one location-dependent correction value.

Location-dependent correction values can be described analytically as a two-dimensional function. However, it is frequently sufficient for the photomask to be divided into appropriate regions, for example into rectangles and squares, and for the correction values within the defined regions to be assumed as being constant. By way of example, the distribution of the critical dimension of a pattern element and/or a mark over the photomask can be measured before analyzing the defective locations of a photomask. It is possible to define, from the determined distribution of the CD, regions of the mask in which the CD and thus the location-dependent correction value or values are considered to be constant. Subsequently, the correction values for the different regions of the photomask are calculated and saved, for example, in a table. At the beginning of an inspection procedure of the defective locations of a photomask, the respectively locally valid correction value or values is/are taken from the table, and the reference data or the reference image are corrected therewith.

Analyzing the defective location can comprise superposing the measurement data image and the corrected reference image and identifying differences between the superposed images. Identifying differences between superposed images can comprise producing a difference image by subtracting the corrected reference image from the measurement data image. Superposing the measurement data image and the corrected reference image can furthermore comprise determining in a pixel-wise manner an area of the at least one defect of the at least one defective location.

Analyzing the at least one defective location can comprise determining a contour for the at least one defect of the at least one defective location. Analyzing the at least one defective location can furthermore comprise determining a repair shape for the at least one defect of the at least one defective location.

Determining the contour can comprise superposing the reference data of the defective location and the measurement data of the defective location and identifying differences between the superposed reference data and the measurement data. Identifying differences between the superposed reference data and the measurement data can comprise producing a difference image by subtracting the reference image from the measurement data image. Superposing the measurement data image and the reference image can furthermore comprise determining in a pixel-wise manner one of the at least one defect of the at least one defective location. Correcting the contour can comprise correcting, in a pixel-wise manner, the contour with the at least one location-dependent correction value.

In this embodiment, the location-dependent correction value or values is/are not applied to the reference data but to the contour of the defective location or of the defect.

Determining the at least one location-dependent correction value can comprise: defining a figure of merit between the measurement data of the at least one defective location and the reference data of the defective location, and minimizing the figure of merit by varying the measurement data of the at least one defective location.

The figure of merit can comprise a critical dimension (CD) of the measurement data and a critical dimension (CD) of the reference data, and minimizing the figure of merit can comprise adapting the CD of the measurement data to the CD of the reference data.

The figure of merit can comprise the CD of at least one structure element of a measurement data image and the CD of at least one structure element of a reference data image, and minimizing the figure of merit can comprise adapting the CD of the at least one structure element of the measurement data image to the CD of the at least one structure element of the reference data image.

The figure of merit can comprise a spacing between the structure elements of a measurement data image and the structure elements of the reference data image, and minimizing the figure of merit can comprise maximizing a superposition of the structure elements of the measurement data image and of the structure elements of the reference data image.

The figure of merit can comprise parameters of a point spread function, and minimizing the figure of merit can comprise varying the parameters of the point spread function, such that the measurement data attain correspondence with the reference data in a region around the at least one defective location.

Determining the at least one location-dependent correction value can comprise: minimizing the figure of merit in a region of the photolithographic mask around the at least one defective location, wherein the region excludes the at least one defective location, and wherein the region is larger than the at least one defective location.

A method according to the invention may furthermore include the step of: repairing the at least one defect of the defective location using the contour that has been determined for the at least one defect or using a contour that has been corrected with at least one location-dependent correction value. Repairing the at least one defect of the at least one defective location can comprise: depositing absorbing and/or phase-shifting material onto a substrate of the photolithographic mask or onto a capping layer of a photolithographic mask for the extreme ultraviolet (EUV) wavelength range and/or removing absorbing and/or phase-shifting material from the substrate of the photolithographic mask or from a capping layer of the photolithographic mask for the (EUV) wavelength range. Repairing the at least one defect of the at least one defective location can furthermore comprise providing at least one particle beam and at least one precursor gas at the defective location. In addition, the at least one particle beam can comprise an electron beam, and the electron beam can be used not only for repairing, but also for scanning the at least one defective location.

In accordance with a different aspect, a computer program comprises instructions which, when executed by a computer system, prompt the computer system to carry out the method steps of the aspects specified above.

Moreover, in a different exemplary embodiment, a solution to the above-mentioned problem is achieved by way of an apparatus for analyzing at least one defective location of a photolithographic mask, in which the apparatus includes: (a) means for obtaining measurement data for the at least one defective location of the photolithographic mask; (b) means for determining reference data of the defective location from computer-aided design (CAD) data for the photolithographic mask; (c) means for correcting the reference data with at least one location-dependent correction value; and (d) means for analyzing the defective location by comparing the measurement data to the corrected reference data.

Finally, in a further exemplary embodiment, an apparatus for analyzing at least one defective location includes: (a) means for obtaining measurement data for the at least one defective location; (b) means for determining reference data of the defective location from computer-aided design (CAD) data for the photolithographic mask; (c) means for determining a contour of the at least one defective location from the measurement data and the reference data; and (d) analyzing the defective location by correcting the contour with at least one location-dependent correction value.

DESCRIPTION OF DRAWINGS

The following detailed description describes currently preferred exemplary embodiments of the invention, with reference being made to the drawings, in which.

DETAILED DESCRIPTION

Preferred embodiments of a method according to the invention and of an apparatus according to the invention are explained in more detail below. These are discussed with reference to the example of the analysis of an opaque defect of binary transmissive photolithographic masks. However, the application of the method according to the invention and of the apparatus according to the invention is not limited to binary transmissive photolithographic masks. Rather, they can be used for analyzing any reflective and transmissive photomasks. It is moreover possible for the method introduced and the apparatus introduced to be used for inspecting defects of templates for imprint lithography. In addition, an apparatus according to the invention and a method according to the invention can be used for analyzing defects on a substrate if the substrate has at least one structure element near the defective location and the inspection of the defective location is performed on the basis of design data.

Figure 2:
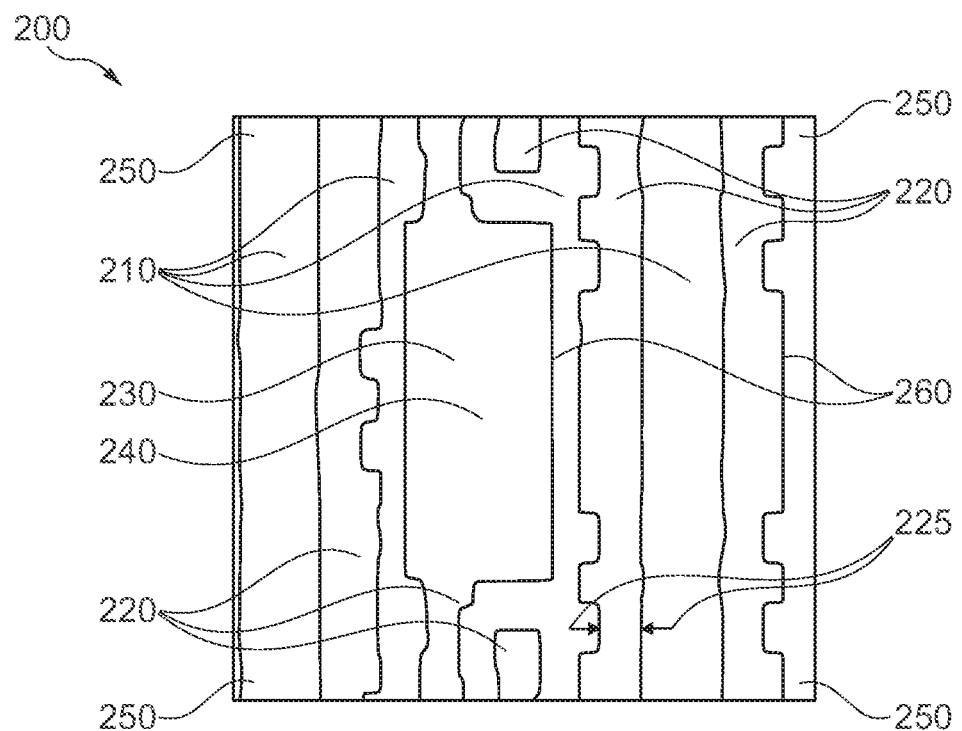
FIG. 2 represents a plan view of a section of an SEM recording of a photolithographic mask having a defective location.

FIG. 2 shows a section of a scanning electron microscope (SEM) image of a photolithographic mask 200. The photomask 200 includes a substrate 210 and pattern elements 220. The photomask 200 can be any transmissive or reflective photolithographic mask. The pattern elements 220 can comprise absorbing material, for example chromium or aluminum. Alternatively, the pattern elements 220 can comprise a phase-shifting material, for example quartz. It is furthermore possible for the pattern elements 220 to include a material that not only shifts the phase of the actinic light by a defined angle but also absorbs a prescribed percentage of the incident radiation. By way of example, a molybdenum-doped silicon oxynitride layer exhibits said properties.

The pattern elements 220 of the photomask 200 have a critical dimension (CD) 225. The critical dimension describes the maximum lateral deviation from a prescribed setpoint value that a pattern element 220 may have to still fulfill a prescribed specification.

Figure 1:
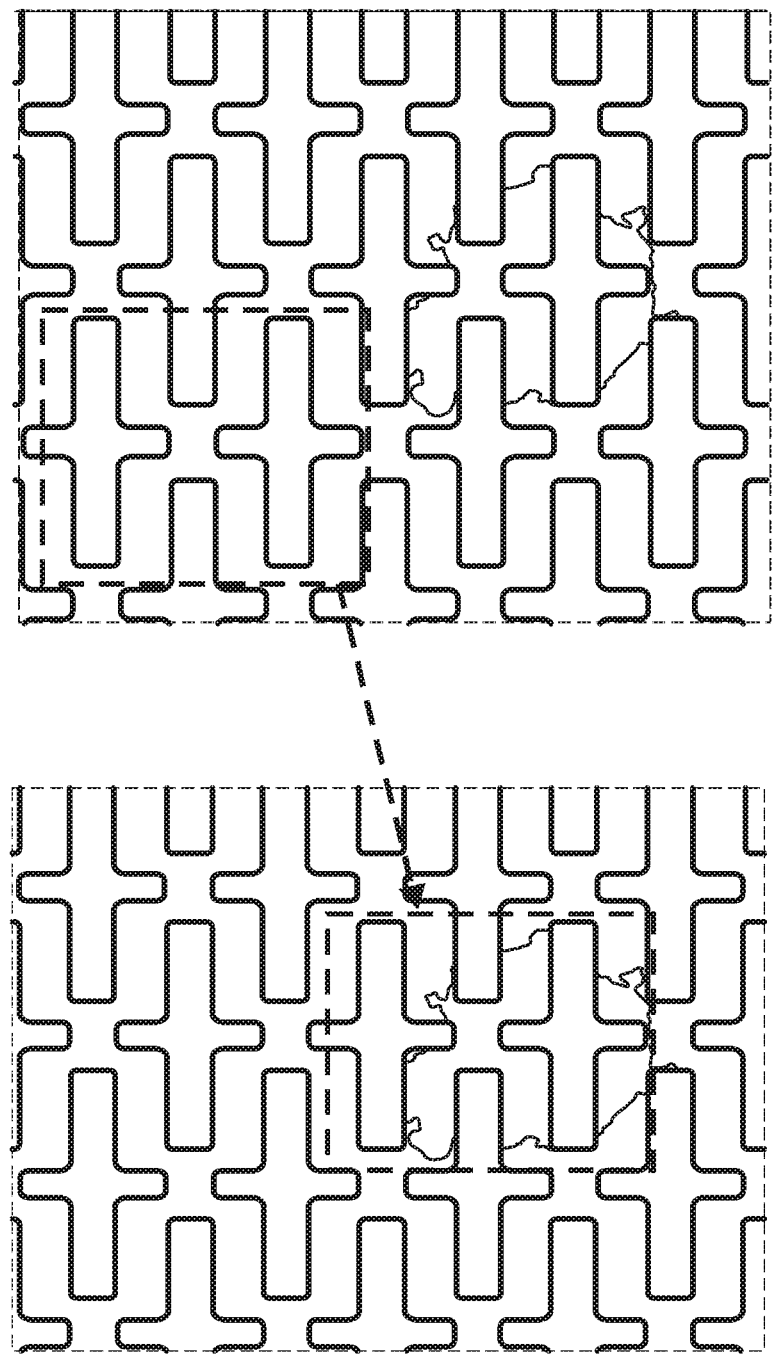
FIG. 1: The upper partial image illustrates a section of a scanning electron microscope (SEM) image of a photolithographic mask in which a defective location is situated that extends over a plurality of pattern elements and has, in the lower left-hand portion, a defect-free reference region that is indicated by way of a rectangle, and the lower partial image presents a superposition of the reference region of the upper partial image (symbolized by the arrow) and the defective location of the photolithographic mask of the upper partial image.

The photolithographic mask 200 furthermore has a defective location 230 having a defect 240. In the example illustrated in FIG. 2, the defective location 230 and the defect 240 have the same dimensions. This is due to the substantially rectangular shape of the defective location 230. The defect 240 has been deliberately deposited on the photomask 200 for analysis purposes and is markedly different from the external contour of the defective location illustrated in FIG. 1.

The defect 240 of the defective location 230 has the same material composition as the pattern elements 220 of the photolithographic mask 200. Furthermore, the height of the defective location 230 in the example of FIG. 2 substantially corresponds to the height of the pattern elements 220. To apply the method defined here for analyzing a defined location 230 of a photolithographic mask 200, none of these conditions need to be met.

In the example illustrated in FIG. 2, the defective location 230 borders a plurality of pattern elements 220. This constitutes an additional complication in the analysis of the defective location 240. However, the method that has been introduced in this application can also be used to inspect isolated defective locations or defective locations that border just one pattern element 220 (not illustrated in FIG. 2). The method discussed can be used to analyze defective locations 230 of any material composition and contour.

The example illustrated in FIG. 2 shows a defect of excess absorber material. This defect is referred to as an opaque defect in the art. The method presented in this application can also be used for analyzing a defect of missing absorber material (referred to as a clear defect in the art) (not illustrated in FIG. 2). Moreover, the described method can also be used for analyzing defects of a mask substrate (not illustrated in FIG. 2).

In the example of FIG. 2, an electron beam scans a region 250 (i.e. the image field indicated in FIG. 2 or the indicated image region) around the defective location 230 to obtain measurement data for the defect 240. The region 250 will also be referred to as measurement data image 250 below. Similar to the case of FIG. 1, the electron beam produces a light boundary 260 along the boundaries of the pattern elements 220 and the defective location 230. The light boundary is the result of the image formation in a scanning electron microscope (SEM). Owing to the topography contrast of an electron beam, edges or corners of an imaged structure are accentuated by a light boundary. This also applies to a mark that can be situated on the photomask 200 for finding the defective structure 230 (not illustrated in FIG. 2).

Measurement data for the defective location 230 can be obtained by scanning it using a laser beam (not illustrated in FIG. 2). It is moreover possible for the defective location 230 to be scanned with an atomic force microscope (AFM) in order to obtain measurement data of the defective location 230 (not illustrated in FIG. 2).

Figure 3:
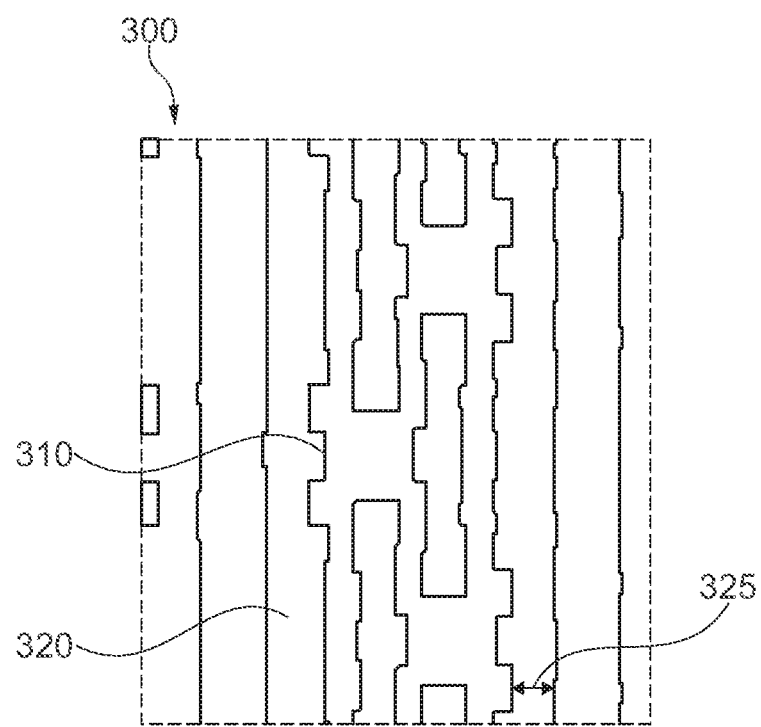
FIG. 3 presents a plan view of the CAD data of a portion of the section of the photolithographic mask in FIG. 2 which comprises the defective location.

FIG. 3 presents the CAD data 300 for a partial region of the section of the photolithographic mask 200 of FIG. 2. The substrate 210 of the photomask 200 is illustrated in FIG. 3 by way of the black regions 310. The pattern elements 220 of the photomask 200 are represented in FIG. 3 by way of the white structures 320. The pattern elements 320 have the CD 325. The CAD data 300 do not have the defective location 230 or the defect 240 of FIG. 2.

Figure 4:
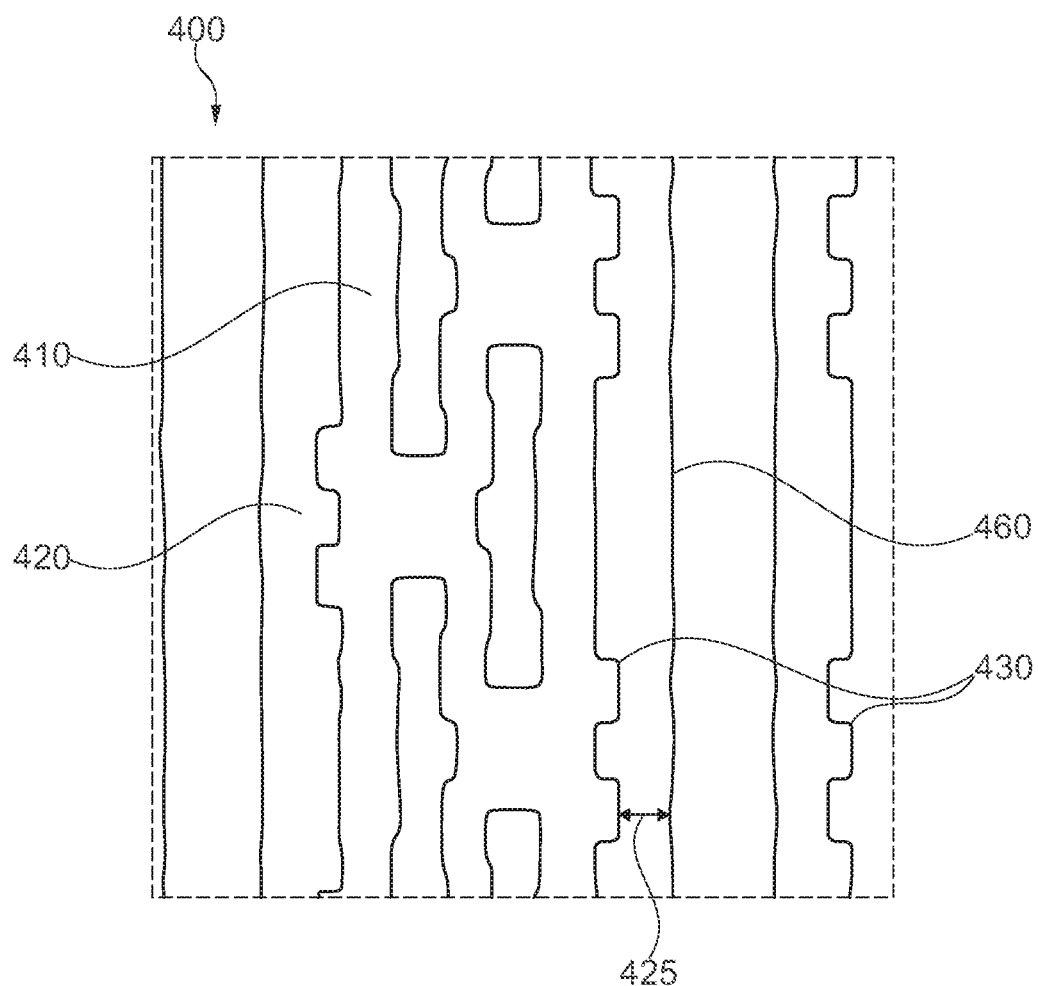
FIG. 4 shows a reference image synthesized from the CAD data of FIG. 3.

FIG. 4 shows a reference image 400 that has been synthesized, or "rendered," from the CAD data 300 of FIG. 3. The synthesis process transfers the structure elements or the pattern elements 320 of the CAD data 300 into structure elements or pattern elements 420, as would be produced on the substrate 210 of the photolithographic mask 200 by a mask production process. The pattern elements 420 have rounded corners 440, unlike the pattern elements 320. In the reference image 400 of FIG. 4, the pattern elements 420 have the CD 425. Furthermore, light boundaries 460 were added to the pattern elements 420 of the reference image 400 to simulate the imaging process using an electron beam.

Figure 5:
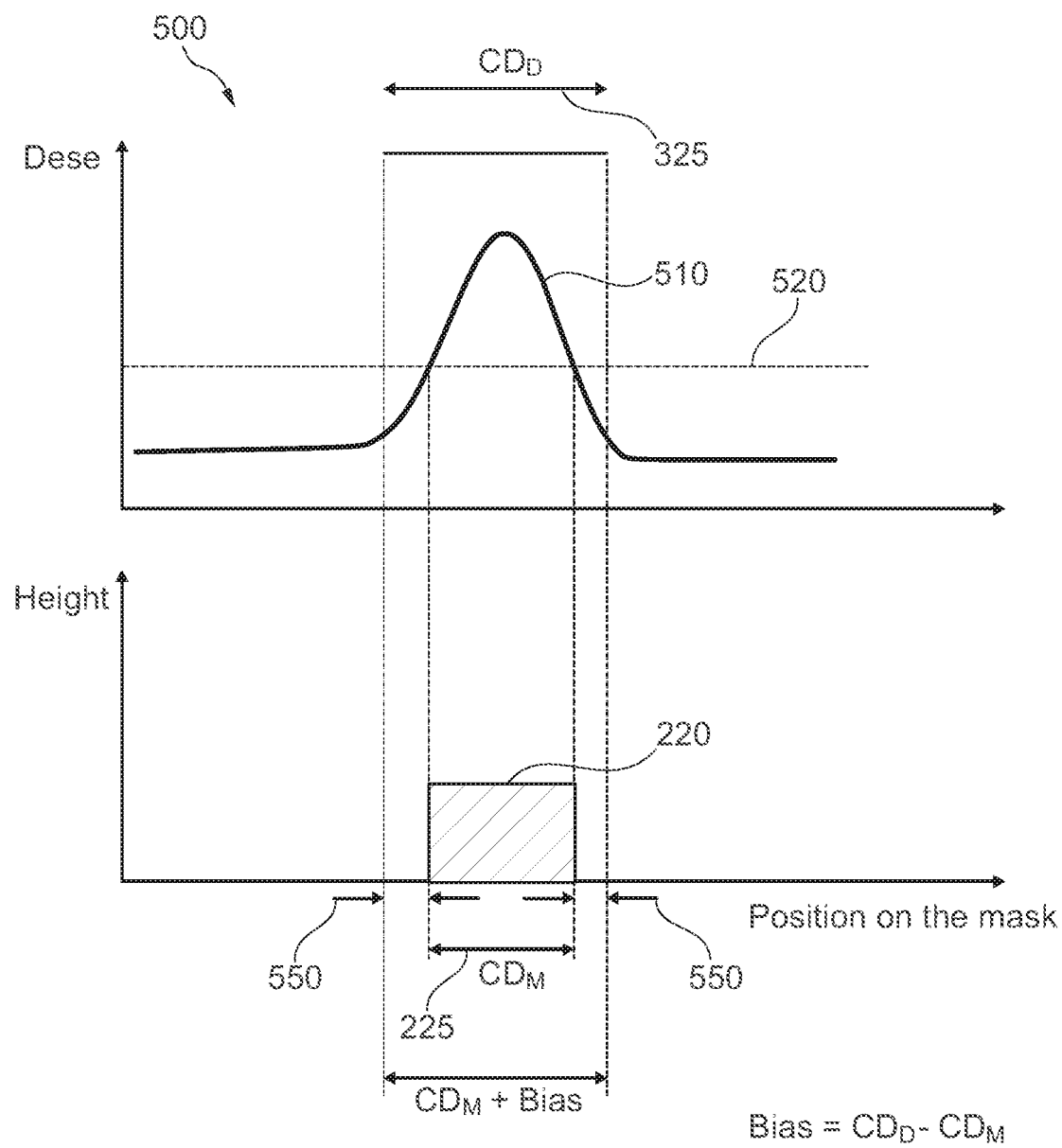
FIG. 5 illustrates the principle of a mask production process.

The diagram 500 in FIG. 5 schematically illustrates a mask production process. The pattern element 320 having a prescribed critical dimension (CD) $CD_D$ 325 of the CAD data 300 is produced on the substrate 210 of the photomask 200 using the mask fabrication process. To this end, a photoresist layer is applied to the absorber layer of the photomask 200. The photoresist layer is then exposed using an electron beam. The upper partial image in FIG. 5 presents the dose distribution 510 applied into the photoresist layer by the electron beam. The threshold value 520 of the dose distribution 510 defines the dose starting from which the photoresist generates the pattern element 220 on the substrate 210 of the photomask 200. In the example illustrated in FIG. 5, the $CD_M$ 225 on the photomask 200 is smaller than the $CD_D$ 325 in accordance with the design for the pattern element 320. The difference between the $CD_D$ 325 of the pattern element 320 in accordance with the design and the actually realized $CD_M$ 225 of the pattern element 220 of the photomask 200 is referred to—as already mentioned above—as bias 550.

The simulation of a mask production process is typically performed using a point spread function (PSF). Frequently, a point spread function is described by the addition of two Gaussian distributions (cf. EP 2 983 193 specified in the first part):

$$f(r) = \frac{1}{\pi(1+\eta)}\left(\frac{1}{\alpha^2}e^{\frac{-r^2}{\alpha^2}} + \frac{\eta}{\beta^2}e^{\frac{-r^2}{\beta^2}}\right) \qquad (1)$$

wherein r designates the radial position of a point with respect to the center of the electron beam, α designates the full width at half maximum of the incident electron beam, +β designates the full width at half maximum of the backscattered electrons, and η describes the ratio of the intensities of the incident and reflected radiation distributions.

If the bias 550 is not rotationally symmetric in the mask plane, a superposition of two of the Gaussian distributions stated above can be selected. A first equation (1) can here describe the bias 550 in an x-direction and a second equation (1) can describe the bias 550 in a y-direction of the reference image 400. The two axes are preferably perpendicular with respect to one another, without this being absolutely necessary. The orientation of the x-axis and the y-axis with respect to the reference image can be selected in arbitrary fashion. If required, it is also possible to combine three or more functions of the equation (1) for taking into account an asymmetry of the bias 550.

In order to be able to superpose the reference image 400 with the measurement data image 250, it is necessary to correct the reference image 400 with the bias 550. An exemplary embodiment will be indicated below as to how this may be realized.

For synthesizing the reference image 400 from the CAD data 300, the parameters α, β and η of the Gaussian distributions of the point spread function of equation (1) must be determined with a sufficient accuracy, or else the structure elements 420 of the synthesized reference image 400 will have a different bias than the structure elements 220 of the photomask 200. Superposition of a reference image whose bias is not adapted to the bias 550 of the photomask 200 gives an incorrect localization of the defective location 230 and of the defect 240 of the photolithographic mask 200. Any repair of the defect 240 on the basis of the localization that has been determined in this manner would give an unsatisfactory result.

Figure 6:
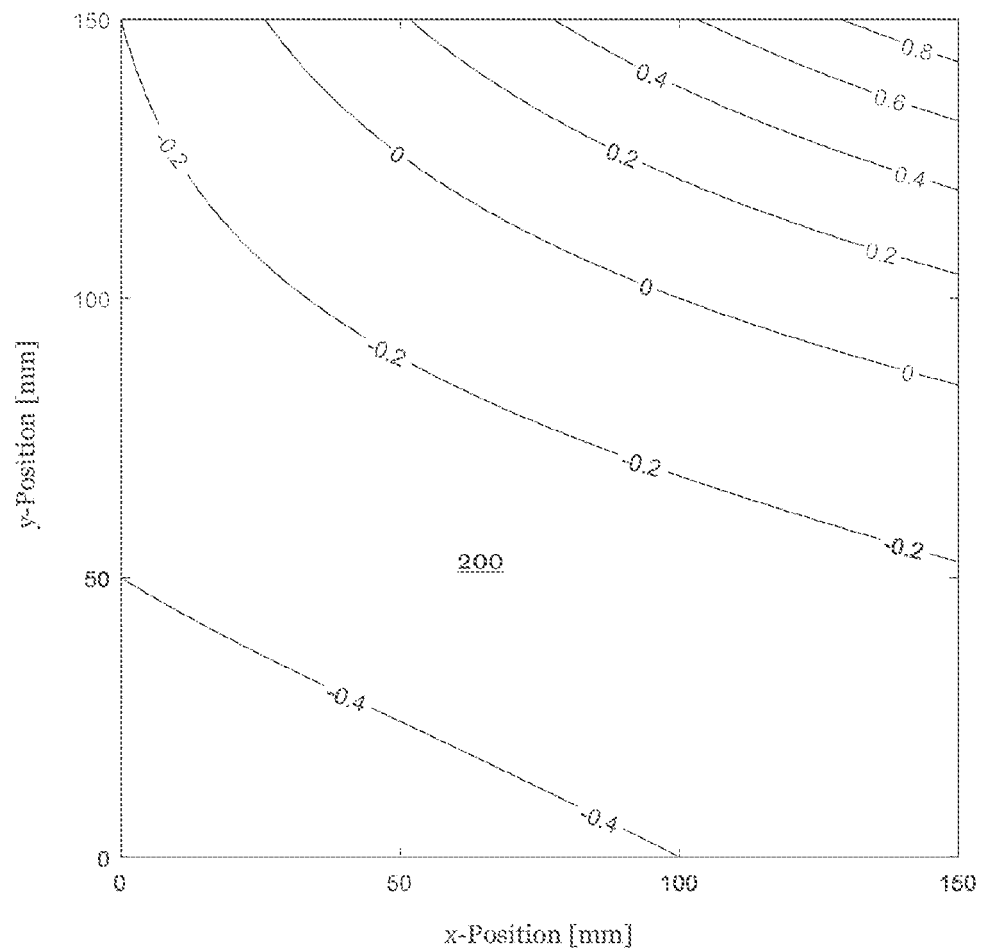
FIG. 6 schematically presents a variation of the critical dimension (CD) over a photolithographic mask.

However, a correction of the reference image 400 with a single global bias 500 is frequently not sufficient for making the reference image 400 coincide with the measurement data image 250. FIG. 6 shows a plan view of the entire photolithographic mask 200. The curved lines 610 in FIG. 6 illustrate that the photomask 200 has a systematic variation of the CD 225 of the structure elements 220 over the area of the mask. In the region of the line designated with "0", the photomask 200 has the dimensions of the pattern elements 320 in accordance with the design, i.e. $CD_D=CD_M$. In the example illustrated in FIG. 6, the bias 550 in the lower half of the photomask 200 gradually increases with a negative sign in the direction of the lower left-hand corner. In the direction of the upper right-hand corner of the photomask 200, the bias 550 increases more strongly than in the opposite direction. The increase of the bias 550 in this direction additionally has a positive sign. The numerical values in FIG. 6 indicate the variation of the $CD_M$ in nanometers. The variation of the CD over the photomask 200 is typically caused by one or more non-perfect processes during the mask production.

In addition to the rather systematic variation of the $CD_M$ of the pattern elements 220 of the photomask 200 in FIG. 6, it is also possible for the $CD_M$ to have rather small-area stochastic variations over the photomask 200 (not illustrated in FIG. 6).

To improve the correspondence of the reference image 400 with the measurement data image 250, a local or location-dependent correction value is determined to take into account the variation of the $CD_M$ during production of a corrected reference image for a specific defective location 230 on the photomask 200.

Determining a location-dependent correction value can be effected in two ways. First, as indicated in FIG. 6, the variation of the CD, or more precisely of the $CD_M$, across the mask 200 can be measured. This can be done, for example, using an SEM. A distribution of the location-dependent correction value or values is then determined from the distribution of the $CD_M$. The location-dependent correction values can be saved in a table in a non-volatile memory of a computer system. At the beginning of an analysis process for a specific defective location 230, the corresponding correction value or values is/are taken from the table, and a corrected reference image is produced from the reference image 400 on the basis of the correction values. In the exemplary embodiment discussed, the location-dependent parameters of the point spread function, i.e. α(x,y), β(x,y) and η(x,y), are the location-dependent correction values for the reference image 400. The deviations δα(x,y), δβ(x,y) and δη(x,y) of the parameters α(x,y), β(x,y) and η(x,y) from the average values <α>, <β> and <η> thereof, with which the reference image 400 was produced, are used to generate a corrected reference image. In the alternative embodiment, these deviations are used to ascertain one or more location-dependent correction values with which a contour of a defective location 230, which was determined from the reference image 400 and the measurement data image 250, is corrected.

As is illustrated in FIG. 6, the location-dependent correction values typically vary gradually over the photomask 200. For this reason, it is frequently sufficient to divide the photomask 200 into regions within which the parameters of the point spread function can be assumed to be constant, i.e. α(x,y)->α(i), β(x,y)->β(i) and η(x,y)->η(i). This simplification reduces the complexity for generating a corrected reference image or correcting the contour of the defective location 230.

In a second exemplary embodiment, the location-dependent correction value or values is/are determined by way of said correction values being ascertained from a best possible correspondence of the reference image 400 with the measurement data image 250. To this end, the difference between the CD 425 of the pattern elements 420 of the reference image 400 and the CD 225 of the measurement data image 250 is minimized. This optimization process provides the local parameters α(i), β(i) and η(i) for the point spread function of equation (1).

Figure 7:
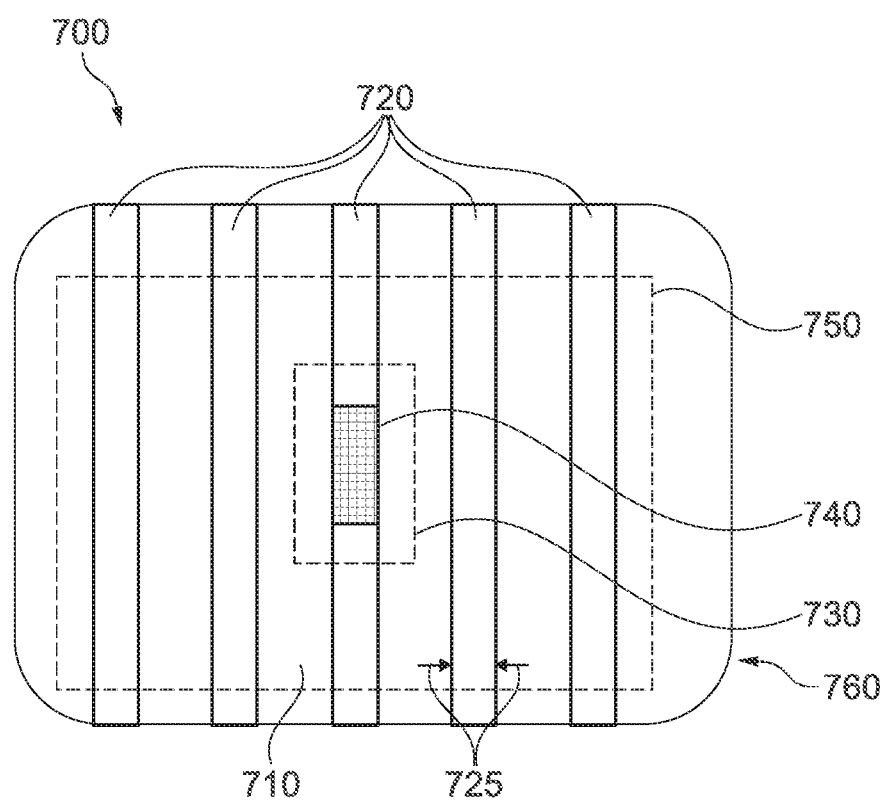
FIG. 7 represents a section from a photomask, illustrating a defective location having a defect in the form of missing absorber material.

FIG. 7 shows a section 760 or an image field 760 of an SEM recording of a photolithographic mask 700. The photomask 700 includes a substrate 710 and pattern elements 720. A pattern element 720 has a defective location 730. The defective location 730 comprises a defect 740 of missing absorber material.

To determine the location-dependent or local correction value or values for a reference image, a region 750 that completely encloses the defective location 730 and is significantly larger than the defective location 730 is selected within the image field 760. The region 750 of the image field 760 is also referred to as the measurement data image 750. The local correction values of the reference image are determined by minimizing the difference between the $CD_M$ 725 of the pattern elements 720 of the photomask 700 in the local measurement data image 750 and the $CD_D$ 425 of the reference image. In this optimization process, the defective location 730 is not inspected. The defective location 730 contains a deviation from the intended layout of the pattern elements 720 of the photomask 700. The defect 740 could influence the result of the minimization process during the comparison of the $CD_M$ 725 with the CD of the pattern elements of the reference image.

Figure 8:
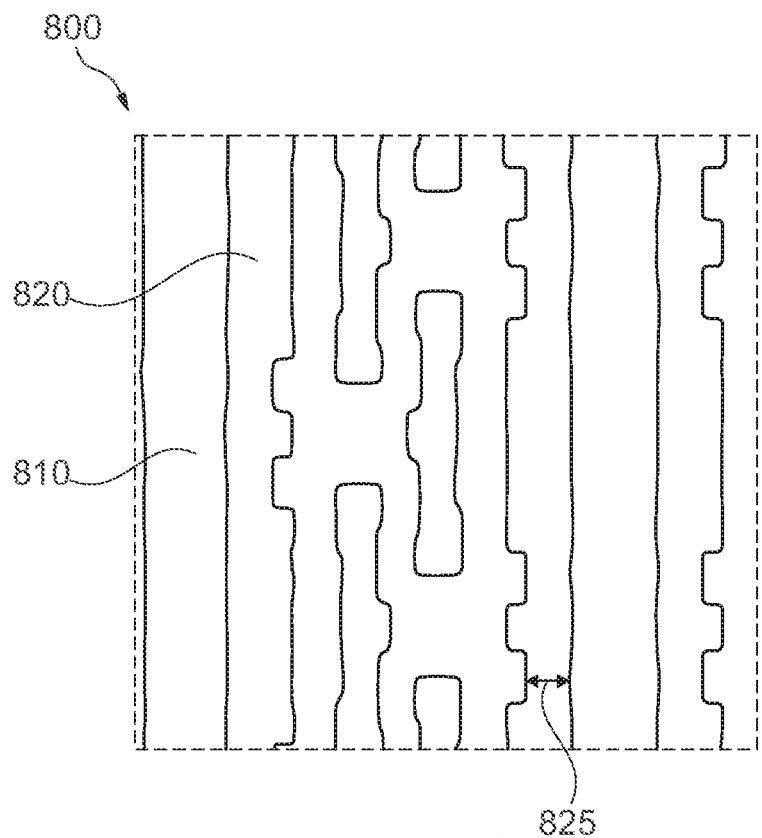
FIG. 8 shows the reference image of FIG. 4 that has been corrected with location-dependent correction values.

FIG. 8 represents a corrected reference image 800 with a substrate 810, corrected pattern elements 820 and corrected CD 825. The corrected reference image 800 corresponds to the reference image 400 in FIG. 4 which has been corrected with a local correction value that is assigned to the defective location 230. The corrected reference image 800 is used in place of the reference region given in FIG. 1 as a comparison standard for analyzing the defective location 230 of the photomask 200. To this end, the corrected reference image 800 is superposed on the measurement data image 250.

Figure 9:
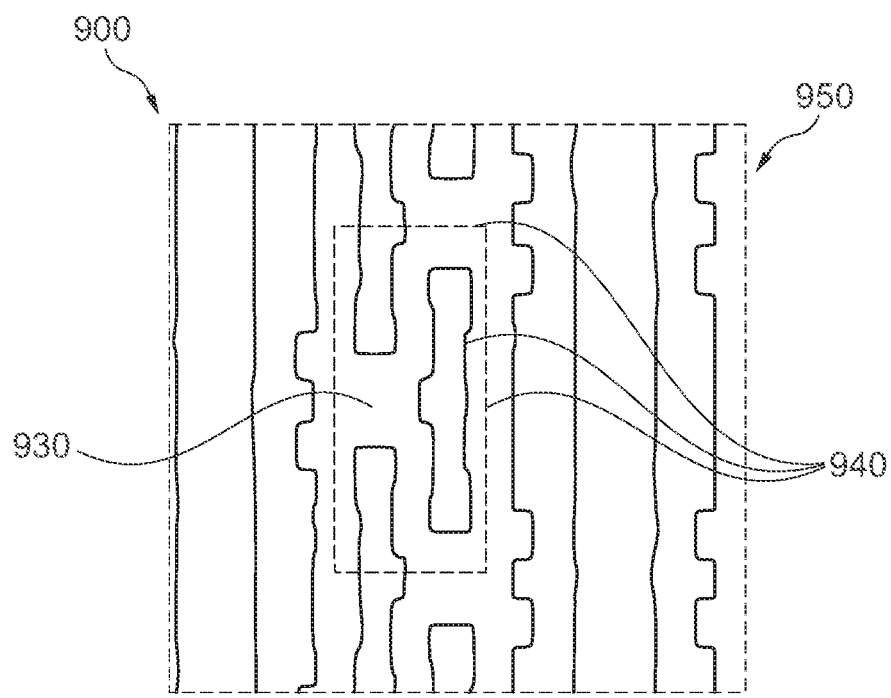
FIG. 9 depicts a superposition of the corrected reference image of FIG. 8 and of the measurement data image of FIG. 2.

The diagram 900 in FIG. 9 shows the contour 930 of the defective location 230 with the defect 240 of the photolithographic mask 200. The contour 930 of the defective location 230 or of the defect 240 is the result of the superposition of the corrected reference image 800 with the measurement data image 250. The external boundaries 940 of the contour 930 of the defect 240 are clearly delineated in the image section 950. The ascertained contour 930 of the defective location 230 can be used directly to repair the defect 240 of the defective location 230. If required, the height profile for the contour 930 of the defect 240 can be determined. The height profile of the contour 930 of the defect can be measured, for example, using an atomic force microscope (AFM).

Figure 10:
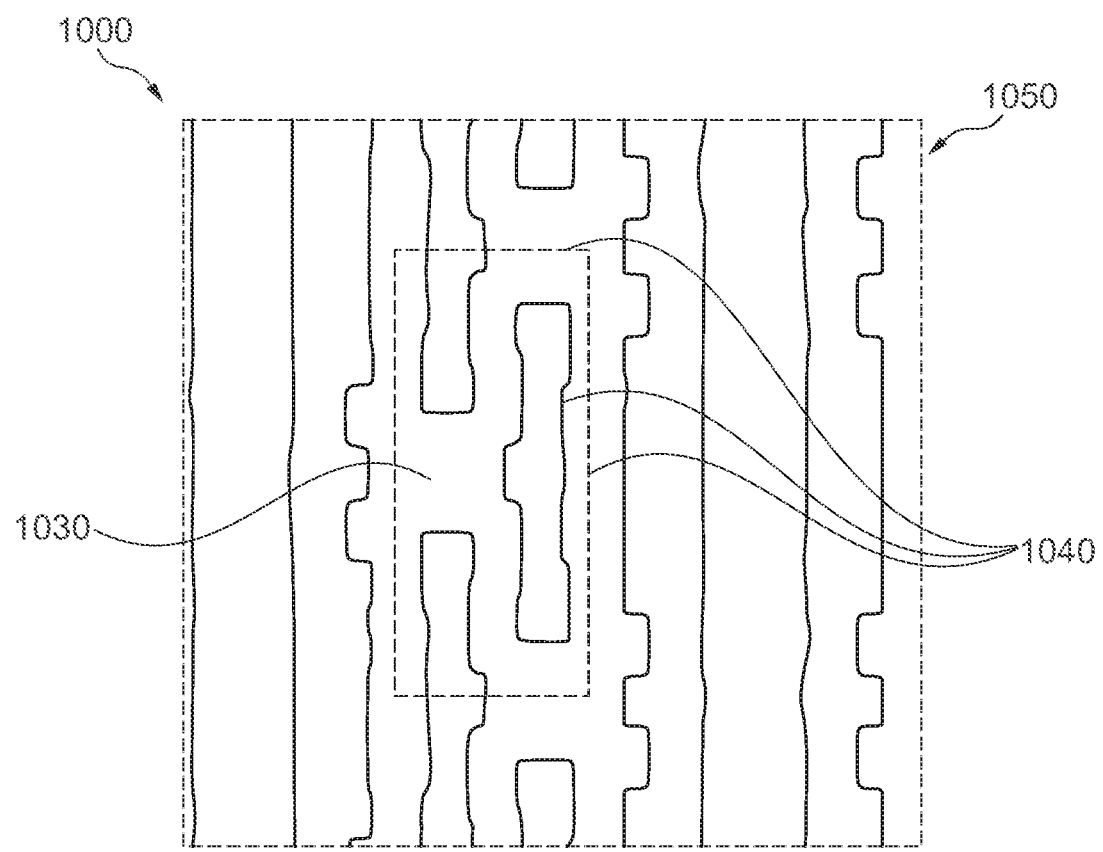
FIG. 10 depicts a superposition of the reference image of FIG. 4 and of the measurement data image of FIG. 2.

The diagram 1000 in FIG. 10 presents the contour 1030 of the defective location 230 with the defect 240 of the photolithographic mask 200. In the second exemplary embodiment, illustrated in FIG. 10, of the method discussed here for analyzing a defective location 230, the contour 1030 of the defective location 230 or of the defect 240 is a result of the superposition of the reference image 400 with the measurement data image 250. The external boundaries 1040 of the contour 1030 of the defect 240 are corrected in a second step with a location-dependent correction value. After this correction step, the contour 1030 of the defective location 230 can be used to correct the defect 240 of the defective location 230. Similar to the statements made above in the context of FIG. 9, it is possible—if necessary—to determine the height profile for the corrected contour 1030 of the defect 240 (not depicted in FIG. 10).

By etching the excess material of the defect 240, said defect 240 can be eliminated. This can be performed, for example, using a focused electron beam induced etching (FEBIE) process. The defect 740 of missing absorber material of the defective location 730 can be repaired using a deposition process performed with an electron beam and one or more precursor gases.

Figure 11:
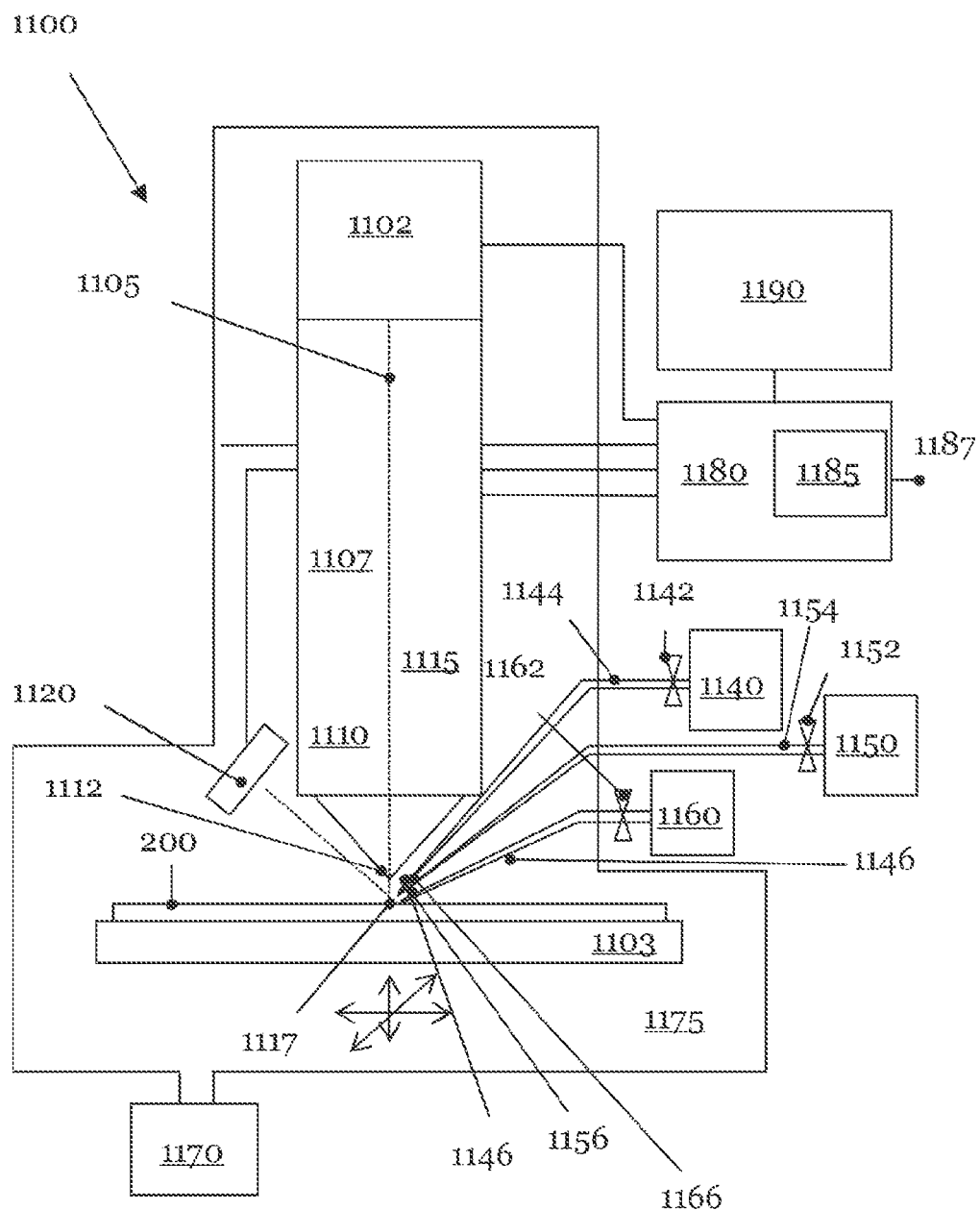
FIG. 11 shows a schematic section through an apparatus, by use of which a defective location of a photolithographic mask may be analyzed and repaired.

FIG. 11 presents a section through an apparatus 1100 with which a method according to the invention can be performed. The device 1100 in FIG. 11 shows a modified SEM 1100. The modified SEM 1100 comprises as essential components a particle gun 1102 and a column 1107, in which the electron optics or beam optics 1110 is arranged. The electron gun 1102 produces the electron beam 1105 and the electron or beam optics 1110 focuses the electron beam 1105 and directs it at the output of the column 1112 onto the mask 200 or 700 and thus acts as a beam shaping apparatus 1110. The column 1107 furthermore comprises a scanning unit 1115 that is designed for scanning the electron beam 1105 over the surface of the mask 200, 700. The scanning unit 1115 thus fulfills the function of a beam guiding apparatus 1115. By scanning the electron beam 1105 over the defective location 230, 730, measurement data of the defects 240, 740 of the defective location 230, 730 can be obtained.

The mask 200, 700 is arranged on the object stage or specimen stage 1103. As symbolized in FIG. 11 by the arrows, the specimen stage 1103 can be moved in three spatial directions in relation to the electron beam 1105 of the SEM 1100.

The apparatus 1100 contains a detector 1120 for detecting the secondary electrons and/or backscattered electrons produced at the measurement point 1117 by the incident electron beam 1105. The detector 1120 is controlled by the control device 1180. Furthermore, the control device 1180 of the apparatus 1100 receives the measurement data of the detector 1120. The control device 1180 can generate measurement data images 250 from the measurement data, said measurement data images being represented on a monitor 1190. Alternatively and/or additionally, the apparatus 1100 can have, a detector, arranged in the form of a ring around the electron beam 1105, in the column 1107, for detecting secondary electrons and/or the electrons backscattered by the mask 200, 700 (not illustrated in FIG. 11).

Moreover, the apparatus 1100 may comprise an ion source which provides low-energy ions in the region of the measurement point 1117, said low-energy ions preventing the mask 200, 700 or the surface thereof from building up a negative surface charge (not illustrated in FIG. 11) during a measurement process of the defective locations 230, 730 or an etching process or a deposition process. With the aid of an ion source, it is possible to reduce a negative charge of the mask 200, 700 in a local and controlled fashion and hence to counteract a reduction in the lateral spatial resolution of the electron beam 1005.

The electron beam 1105 of the apparatus 1100 can additionally be used for analyzing the defect 230, 730 before, during and after the performance of a localized etching process or a deposition process.

The control device 1180 comprises a computer system 1185. The computer system 1185 comprises an interface 1187. The computer system 1185 can be connected to an inspection tool (not illustrated in FIG. 11) via this interface. The computer system 1185 can receive the position or the coordinates of the defect 240, 740 that have been measured by the inspection tool via the interface 1187. The computer system 1185 or the control device 1180 can control the electron beam 1105 on the basis of the received coordinates of the defective location 230, 730. The computer system 1185 can furthermore receive, via the interface 1187, CAD data 300 of the photolithographic mask 200, 700 that can be stored in a non-volatile memory of the computer system 1185 (not illustrated in FIG. 11).

The computer system 1185 or the control device 1180 is designed to scan the electron beam 1105 over the mask 200, 700 using the scanning unit 1115. The scanning unit 1015 controls deflection elements in the column 1107 of the modified SEM 1100, which are not illustrated in FIG. 11. The computer system 1185 or the control device 1180 furthermore comprises a setting unit in order to set and control the various parameters of the modified SEM 1000. Parameters that can be set by the setting unit may be for example: the magnification, the focus of the electron beam 1105, one or more settings of the stigmator, the beam displacement, the position of the electron source and/or one or more stops (not illustrated in FIG. 11).

The computer system 1185 can determine reference data or a reference image 400 from the CAD data 300 by synthesizing or rendering the CAD data 300. The computer system 1185 can furthermore ascertain a location-dependent correction value for the reference data or the reference image 400. The computer system 1185 can generate corrected reference data or a corrected reference image 800 from the location-dependent correction value and the reference data or the reference image 400. In addition, the computer system 1185 is designed to ascertain a contour 930 for the defect 240 by superposing the corrected reference image 800 and the measurement data image 250. The defect 240, 740 can be repaired on the basis of the ascertained contour 930. The computer system 1185 can also determine a contour 1030 for the defective location 230 or the defect 240 from the reference image 400 and the measurement data image 250. In addition, the computer system 1185 of the apparatus 1100 can correct the determined contour 1030 using one or more location-dependent correction values.

If required, a repair shape can be ascertained for the defect 240, 740. For the contour 930 or the corrected contour 1030, the height profile thereof is ascertained to this end. The height profile can be measured, as already mentioned above, using an AFM. The modified SEM can contain one or more AFMs for this purpose (not illustrated in FIG. 11). A repair shape indicates how long, how often and the temporal interval with which an electron beam 1105 acts on a location of a defect 240, 740. A repair shape additionally contains information relating to the gas flow rate of one or more etching gases or one or more deposition gases provided at the respective locations of a defect 240, 740.

The repair shape is used by the computer system 1185 to control the activating particle or electron beam 1105 and the gas flow rates of the various components of a gas used for the defect repair. This means that the computer system 1185 can control the design of a repair shape. In an alternative embodiment, the design of the repair shape is realized outside of the apparatus 1100 (not illustrated in FIG. 11).

The apparatus 1100 for analyzing the defective locations 230, 730 can also be used to correct or repair the defects 240 and 740. To this end, the apparatus 1100 preferably comprises a plurality of different storage containers for storing different gases or precursor gases. Three storage containers 1140, 1150 and 1160 are illustrated in the exemplary apparatus 1100 of FIG. 11. However, an apparatus 1100 may also have only two or more than three storage containers 1140, 1150, 1160 for processing the masks 200 and 700.

The first storage container 1140 stores a precursor gas or a deposition gas, which can be used in cooperation with the electron beam 1105 of the modified SEM 1100 for depositing absorbing material on a clear defect 740 of the mask 700. By way of example, the first storage container 1140 may have a precursor gas in the form of a metal carbonyl, for example molybdenum hexacarbonyl ($Mo(CO)_6$) or chromium hexacarbonyl ($Cr(CO)_6$).

The second storage container 1150 contains a first etching gas. By way of example, the second storage container 1050 can contain xenon difluoride ($XeF_2$) or a chlorine-containing etching gas such as nitrosyl chloride (NOCl), nitryl chloride ($NO_2Cl$) or chlorine nitrate ($ClNO_3$).

The third storage container 1160 in the example illustrated in FIG. 11 stores a gas that can be added to the etching gas of the second storage container 1150. The gas in the third storage container 1160 can comprise, for example, water vapor ($H_2O$) or hydrogen peroxide ($H_2O_2$).

Each storage container 1140, 1150, 1160 is equipped with its own valve 1142, 1152, 1162 to control the amount of gas particles provided per unit of time or the gas flow rate at the location of incidence 1117 of the electron beam 1105 on the surface of the mask 200, 700 that is to be repaired. The valves 1142, 1152, 1162 can be designed in the form of a gas flow or mass flow controller.

Furthermore, the three storage containers 1140, 1150, 1160 have dedicated gas feeds 1144, 1154 and 1164, which end with a nozzle 1146, 1156 and 1166 near the point of incidence 1117 of the electron beam 1105 on the mask 200, 700. In the apparatus 1100 that is illustrated by way of example in FIG. 11, the valves 1142, 1152, 1162 are installed in the vicinity of the storage containers 1140, 1150, 1160. In an alternative embodiment, the valves 1142, 1152, 1162 may be arranged in the vicinity of the corresponding nozzle 1146, 1156, 1166 (not shown in FIG. 11). Each storage container 1140, 1150, 1160 may have a dedicated element for individual temperature setting and control. The temperature setting facilitates both cooling and heating for each of the stored precursor materials. In addition, the gas feeds 1144, 1154, 1164 may likewise respectively have a dedicated element for setting and monitoring the temperature at which the gases are provided at the reaction location 1117 (likewise not shown in FIG. 11).

The apparatus 1100 of FIG. 11 has a pump system 1170 to produce and maintain a required vacuum in the reaction chamber 1175. The reaction chamber 1175 has, before a local electron-beam-induced etching process is performed, a residual gas pressure in the range of the lower end of the high vacuum range ($<10^{-6}$ mbar).

In addition, the apparatus 1100 may include a suction extraction apparatus (not illustrated in FIG. 11). The suction extraction apparatus in combination with the pump system 1170 makes it possible that the fragments or constituents that are produced during the decomposition of the etching gas or the deposition gas and are not required for the local chemical reaction can substantially be extracted from the reaction chamber or vacuum chamber 1175 of the apparatus 1100 at the point of origin. Since the gas constituents that are not required are pumped away locally at the point of incidence 1117 of the electron beam 1105 onto the mask 200, 700 out of the vacuum chamber 1175 of the apparatus 1100 before they can be distributed and settle in it, contamination of the vacuum chamber 1175 is largely prevented by initiating a local chemical etching reaction.

Figure 12:
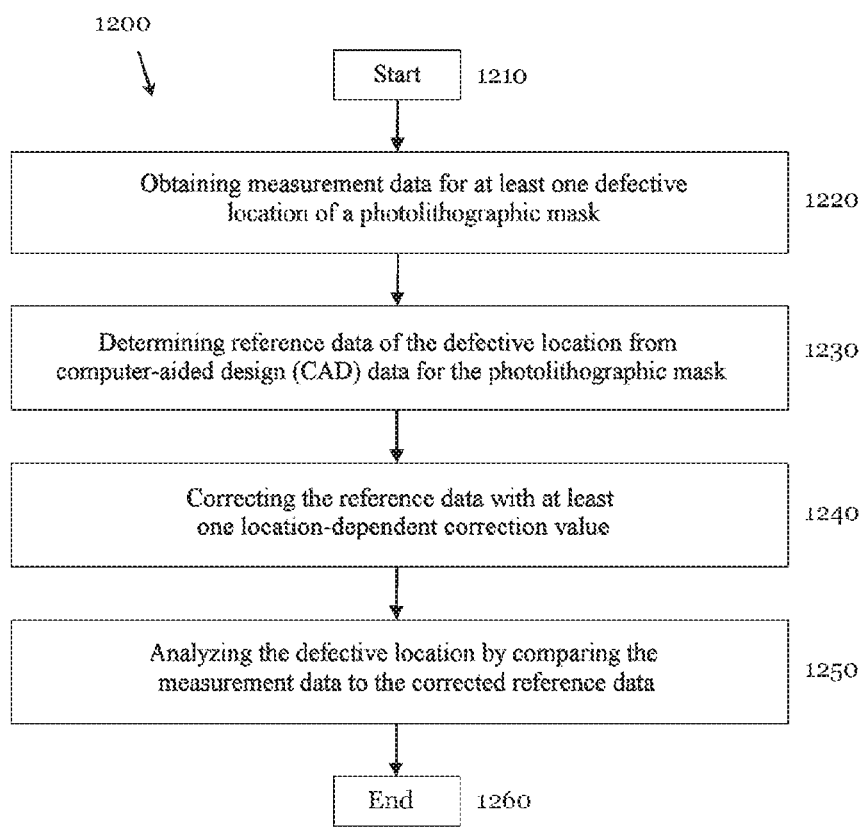
FIG. 12 depicts a flowchart of a first embodiment of the method according to the invention.

FIG. 12 presents a flowchart 1200 of a first embodiment of the method according to the invention for analyzing a defective location 230, 730 of a photolithographic mask 200, 700. The method begins in step 1210. In step 1220, measurement data for a defective location 230, 730 of the photolithographic mask 200, 700 are obtained. The measurement data can be obtained by scanning the electron beam 1105 of the apparatus 1100 over the defective location 230, 730. The apparatus 1100 or the computer system 1185 can receive the position or the coordinates of the defective location 230, 730 from an inspection tool.

In the next step 1230, reference data are or a reference image 400 is determined from computer-aided design (CAD) data 300 for the photolithographic mask 200, 700. This step can be carried out by the computer system 1185 of the apparatus 1100. The CAD data 300 required herefor can be stored in a non-volatile memory of the computer system 1185. Alternatively, the computer system 1185 can receive the CAD data 300 from an external source via the connection 1187.

In step 1240, the reference data or the reference image 400 is/are corrected with at least one location-dependent correction value. This step can likewise be carried out by the computer system 1185 of the apparatus 1100. The location-dependent correction value can be determined by way of the electron beam 1105 of the apparatus 1100, wherein the apparatus 1100 is controlled by the control device 1180 or the computer system.

Next, in step 1250, the defective location 230, 730 is analyzed by comparing the measurement data or the measurement data image 250 to the corrected reference data or the corrected reference image 800. The analysis process provides the contour 930 of the defect 240. This step can likewise be carried out by the computer system 1185 of the apparatus 1100. The method finally ends at 1260.

Figure 13:
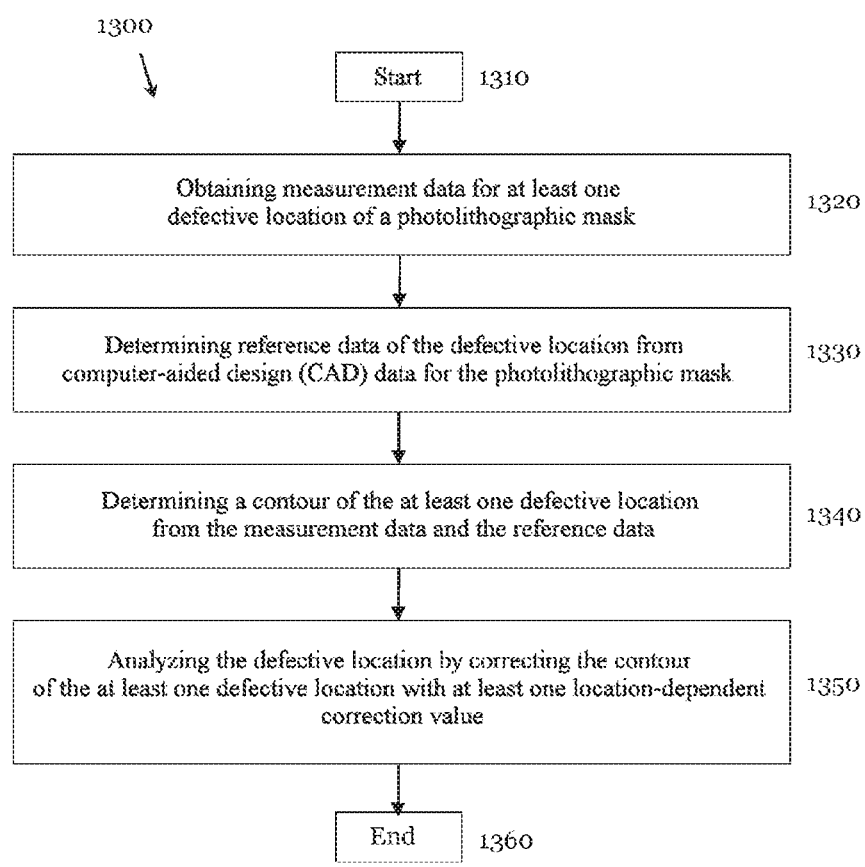
FIG. 13 shows a flowchart of a second exemplary embodiment of the method according to the invention.

Finally, FIG. 13 shows a flowchart 1300 of a second exemplary embodiment of the method according to the invention for analyzing a defective location 230, 730 of a photolithographic mask 200, 700. The method begins in step 1310. The two steps 1320 and 1330 are identical to the two steps 1220 and 1230 in FIG. 12.

In step 1240, a contour 1030 of the defective location 240 is produced from the reference data or the reference image 400 and the measurement data or the measurement data image 250. This step can likewise be carried out by the computer system 1185 of the apparatus 1100.

Next, in step 1350, analysis is performed by correcting the contour 1030 of the at least one defective location 240 with one or more correction values. The location-dependent correction value can be determined as explained in the context of FIG. 12. Thereupon, the method ends at step 1360.

What is claimed is:

1. A method for analyzing at least one defective location of a photolithographic mask, wherein the method comprises the following steps:
  a. obtaining measurement data for the at least one defective location of the photolithographic mask;
  b. determining reference data of the defective location from computer-aided design (CAD) data for the photolithographic mask;
  c. correcting the reference data with at least one location-dependent correction value; and
  d. analyzing the defective location by comparing the measurement data to the corrected reference data.

2. The method of claim 1, wherein obtaining measurement data for the at least one defective location of the photolithographic mask comprises: scanning the at least one defective location with a particle beam.

3. The method of claim 1, furthermore comprising the step of: producing a measurement data image from the measurement data.

4. The method of claim 3, further including the step of: determining the at least one location-dependent correction value by minimizing the difference between the CD of the structure elements of the measurement data image and the CD of the structure elements of the reference image for each of the at least one defective location of the photolithographic mask.

5. The method of claim 4, wherein minimizing the difference between the CD of the structure elements of the measurement data image and the CD of the structure elements of the reference image is effected in a region of the photolithographic mask around the at least one defective location, wherein the region excludes the at least one defective location, and wherein the region is larger than the at least one defective location.

6. The method of claim 5, wherein minimizing the difference between the CD of the structure elements of the measurement data image and the CD of the structure elements of the reference image comprises: determining the parameters of the point spread function in the region around the at least one defective location, with the result that the difference between the CD of the structure elements of the measurement data image and of the reference image becomes minimal.

7. The method of claim 4, wherein determining the at least one location-dependent correction value comprises: performing an algorithm that minimizes the difference between the CD of the structure elements of the measurement data image and the CD of the structure elements of the reference image.

8. The method of claim 4, further including the step of: determining a distribution of the CD of at least one pattern element and/or a mark over the photolithographic mask.

9. The method of claim 8, furthermore including the step of: determining at least one location-dependent correction value from the distribution of the CD of the at least one pattern element and/or the mark, and producing a corrected reference image with the aid of the produced distribution of the CD.

10. The method of claim 1, wherein determining reference data comprises: extracting a section from the CAD data which comprises the at least one defective location of the photolithographic mask.

11. The method of claim 1, wherein determining reference data comprises: synthesizing a reference image from the CAD data.

12. The method of claim 11, wherein synthesizing the reference image furthermore comprises: producing a light boundary for at least one structure element in the reference image.

13. The method of claim 12, wherein the at least one structure element comprises an element from the following: a pattern element of the photolithographic mask, a mark of the photolithographic mask, and a defect of the at least one defective location of the photolithographic mask.

14. The method of claim 11, wherein synthesizing the reference image furthermore comprises: determining parameters of a point spread function that describes an exposure process for the photolithographic mask during a mask production process.

15. The method of claim 11, wherein the at least one location-dependent correction value takes into account a difference between a critical dimension (CD) of the measurement data and the CAD data at the defective location.

16. The method of claim 11, wherein correcting the reference data comprises: forming a corrected reference image by correcting the reference image with the at least one location-dependent correction value.

17. The method of claim 1, wherein synthesizing the reference image comprises: taking into account in the reference image systematic changes that CAD data undergo during a mask production process.

18. The method of claim 1, wherein analyzing the at least one defective location comprises: determining a contour for the at least one defect of the at least one defective location.

19. The method of claim 18, wherein determining the contour comprises: superposing the corrected reference data of the defective location and the measurement data of the defective location, and identifying differences between the superposed corrected reference data and the measurement data.

20. A method for analyzing at least one defective location of a photolithographic mask, wherein the method comprises the following steps:
   a. obtaining measurement data for the at least one defective location of the photolithographic mask;
   b. determining reference data of the defective location from computer-aided design (CAD) data for the photolithographic mask;
   c. determining a contour of the at least one defective location from the measurement data and the reference data; and
   d. analyzing the defective location by correcting the contour of the at least one defective location with at least one location-dependent correction value.

21. The method of claim 20, wherein determining the contour comprises: superposing the reference data of the defective location and the measurement data of the defective location, and identifying differences between the superposed reference data and the measurement data.

22. A non-transitory computer program comprising instructions which, when executed by a computer system, prompt the computer system to carry out the method steps of claim 1.

23. An apparatus for analyzing at least one defective location of a photolithographic mask, including:
   a. means for obtaining measurement data for the at least one defective location of the photolithographic mask;
   b. means for determining reference data of the defective location from computer-aided design (CAD) data for the photolithographic mask;
   c. means for correcting the reference data with at least one location-dependent correction value; and
   d. means for analyzing the defective location by comparing the measurement data to the corrected reference data.

24. An apparatus for analyzing at least one defective location of a photolithographic mask, including:
   a. means for obtaining measurement data for the at least one defective location of the photolithographic mask;
   b. means for determining reference data of the defective location from computer-aided design (CAD) data for the photolithographic mask;
   c. means for determining a contour of the at least one defective location from the measurement data and the reference data; and
   d. analyzing the defective location by correcting the contour with at least one location-dependent correction value.

* * * * *

UNITED STATES PATENT AND TRADEMARK OFFICE
CERTIFICATE OF CORRECTION

PATENT NO. : 11,150,552 B2  
APPLICATION NO. : 16/563303  
DATED : October 19, 2021  
INVENTOR(S) : Michael Budach and Ralf Schönberger It is certified that error appears in the above-identified patent and that said Letters Patent is hereby corrected as shown below:

In the Drawings

Sheet 4 of 11, Fig. 5, delete "Dese" and insert -- Dose --.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*